(12) United States Patent
Utsunomiya et al.

(10) Patent No.: US 8,748,790 B2
(45) Date of Patent: Jun. 10, 2014

(54) PROXIMITY SENSOR USING PHOTOSENSOR

(75) Inventors: Fumiyasu Utsunomiya, Chiba (JP); Taro Yamasaki, Chiba (JP); Isamu Fujii, Chiba (JP)

(73) Assignee: Seiko Instruments Inc., Chiba-Shi, Chiba (JP)

( * ) Notice: Subject to any disclaimer, the term of this patent is extended or adjusted under 35 U.S.C. 154(b) by 525 days.

(21) Appl. No.: 13/069,831

(22) Filed: Mar. 23, 2011

(65) Prior Publication Data
US 2011/0234302 A1 Sep. 29, 2011

(30) Foreign Application Priority Data
Mar. 25, 2010 (JP) ................................. 2010-071084

(51) Int. Cl.
*H01L 27/00* (2006.01)
*H01L 31/00* (2006.01)
*H04N 7/18* (2006.01)
*G03B 17/00* (2006.01)
*H01L 27/088* (2006.01)

(52) U.S. Cl.
USPC ..................... 250/208.1; 250/214.1; 348/154; 396/153; 257/401

(58) Field of Classification Search
CPC ................... H01L 27/14643; H01L 27/14601; H01L 27/00
USPC ........ 250/208.1, 214 R, 214.1; 327/132, 333, 327/514, 515; 257/288, 348, 373, 401, 465; 348/152–155, 352; 396/153
See application file for complete search history.

(56) References Cited

U.S. PATENT DOCUMENTS

| 4,826,777 A * | 5/1989 | Ondris ............................. 438/80 |
| 2010/0295979 A1* | 11/2010 | Taka et al. ..................... 348/300 |
| 2011/0001728 A1* | 1/2011 | Hosorogi ...................... 345/175 |

FOREIGN PATENT DOCUMENTS

JP 2004-056905 A 2/2004

* cited by examiner

*Primary Examiner* — Georgia Y Epps
*Assistant Examiner* — Don Williams
(74) *Attorney, Agent, or Firm* — Brinks Gilson & Lione (57) ABSTRACT

Provided is a proximity sensor using a photosensor, which is easy to use and reduced in power consumption. In the proximity sensor, a first photosensor is used to detect a change in amount of ambient light entering the first photosensor, which is caused when a finger is coming close thereto, and a detection signal is output based on a result of the detection. The photosensor includes, for example, one or a plurality of PN junction elements connected in parallel.

14 Claims, 5 Drawing Sheets

PROXIMITY SENSOR USING PHOTOSENSOR

RELATED APPLICATIONS

This application claims priority under 35 U.S.C. §119 to Japanese Patent Application No. 2010-071084 filed on Mar. 25, 2010, the entire content of which is hereby incorporated by reference.

BACKGROUND OF THE INVENTION

1. Field of the Invention

The present invention relates to a proximity sensor, and more particularly, to a proximity sensor using a photosensor reduced in power consumption compared with a conventional one.

2. Description of the Related Art

A conventional proximity sensor using a photosensor is capable of detecting a finger or the like coming close thereto by emitting light by itself and detecting reflection light on the finger or the like coming close thereto by means of the photosensor (see, for example, Japanese Patent Application Laid-open No. 2004-56905 (FIG. 1)).

Figure 10:
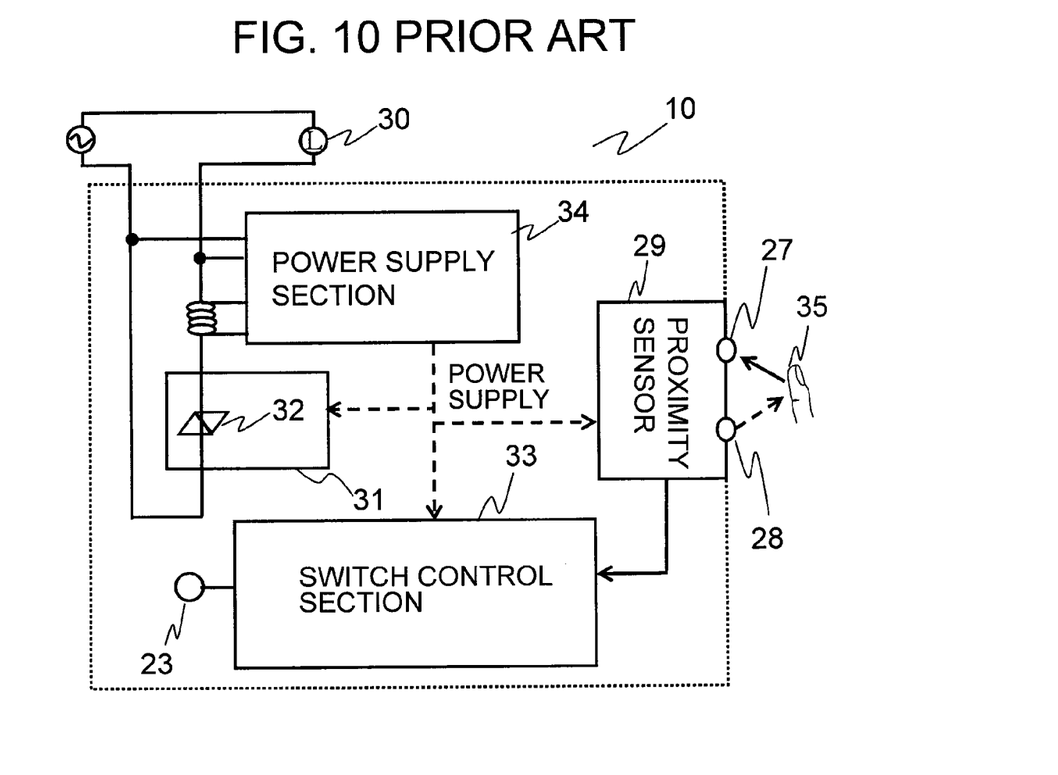
FIG. 10 is a schematic circuit block diagram illustrating a circuit configuration of a conventional proximity sensor.

FIG. 10 illustrates a circuit block diagram of a non-contact switch using the conventional proximity sensor. The non-contact switch 10 includes a proximity sensor 29 of type using reflection light having a light receiving part 27 and a light projecting part 28, a switch circuit 31 connected in series to a load such as a lighting tool 30 as an example of an electronic device, a triac (example of switch means) 32 constituting a semiconductor switch element of the switch circuit 31, a switch control section 33 for turning ON/OFF the triac 32 based on an output of the proximity sensor 29, and a power supply section 34 for supplying power to those components.

The proximity sensor 29 has a well-known configuration, in which the light projecting part 28 using a light-emitting diode emits an infrared pulse to be reflected on a human hand 35 as an example of a target, and when the light receiving part 27 using a phototransistor or a photodiode receives light reflected off the human hand 35, the proximity sensor 29 sends an output of ON to the switch control section 33.

When a signal is input to a gate of the triac 32 provided in the switch circuit 31, the triac 32 becomes a conductive element with respect to AC power supply after the input of the signal until the polarity of AC power supply is changed. If the proximity sensor 29 is turned ON, the triac 32 is turned ON based on a signal transmitted from the switch control section 33.

When the proximity sensor 29 detects the human hand 35 or the like, if the human hand 35 moves back and forth in front of the proximity sensor 29, the proximity sensor 29 is turned ON/OFF for each detection of the human hand 35. This may result in unnaturally high responsivity of the proximity sensor 29. As a countermeasure, for example, the switch control section 33 is provided with a timer circuit for about 1 to 2 seconds so as to realize a delay circuit for preventing the triac 32 from being turned OFF unless the timer circuit counts up immediately after the proximity sensor 29 is turned ON.

The switch control section 33 is further provided with an operation indicator 23 which lights up when the proximity sensor 29 is turned ON. The operation indicator 23 lights up only when the proximity sensor 29 is turned ON and the triac 32 is turned ON. Alternatively, the operation indicator 23 may employ a two-color light-emitting diode so that green (or yellow) light may be emitted when the proximity sensor 29 is OFF while red light may be emitted when the proximity sensor 29 is ON. Note that, the triac 32 may be connected to a neon tube at both ends thereof for display during OFF of the triac 32.

With such a configuration of the non-contact switch 10 of the conventional technology, under a state in which no power is supplied to the lighting tool 30, that is, when the triac 32 of the non-contact switch 10 is in a non-conductive state, the power supply voltage is applied across the triac 32, and accordingly the power supply section 34 rectifies the power supply voltage to a constant voltage to be supplied to the switch circuit 31, the proximity sensor 29, and the switch control section 33. Then, when the proximity sensor 29 detects the human hand 35 and thereby starts to operate, the proximity sensor 29 supplies an output of the detection to the switch control section 33 so that a signal may be sent to the switch circuit 31, specifically, a signal may be sent to the triac 32 with a phase angle of 15° to 20° with respect to the half wavelength) (180°, to thereby turn ON the switch circuit 31.

Across the triac 32, a small voltage as a part of the power supply voltage is generated. The power supply section 34 rectifies the generated voltage to obtain minute power, and converts the power to a constant DC voltage to be supplied to the switch circuit 31, the proximity sensor 29, and the switch control section 33. This configuration enables power supply even if the switch circuit 31 continues to be turned ON.

The conventional proximity sensor using a photosensor employs a proximity sensor of type using reflection light and needs to emit light by itself, which leads to a problem of very large current consumption, and further the light receiving part for detecting the reflection light has a complicated circuit configuration, which leads to a problem of large current consumption. In addition, there is another problem that the battery life for battery drive significantly reduces, which makes it difficult to utilize battery drive.

SUMMARY OF THE INVENTION

The present invention has been made in view of the above-mentioned problems, and therefore provides a proximity sensor which is reduced in current consumption compared with a conventional proximity sensor.

In order to solve the above-mentioned problems inherent in the conventional proximity sensor, a proximity sensor according to the present invention includes: at least one first photosensor for detecting a target; and at least one second photosensor positioned in an area in which the target is not detected, for detecting ambient light.

The proximity sensor according to the present invention does not need to emit light by itself and accordingly has a simple circuit configuration, and hence current consumption may be reduced compared with the conventional proximity sensor.

DETAILED DESCRIPTION OF THE PREFERRED EMBODIMENTS

Now, referring to the accompanying drawings, embodiments of the present invention are described below.

Figure 1:
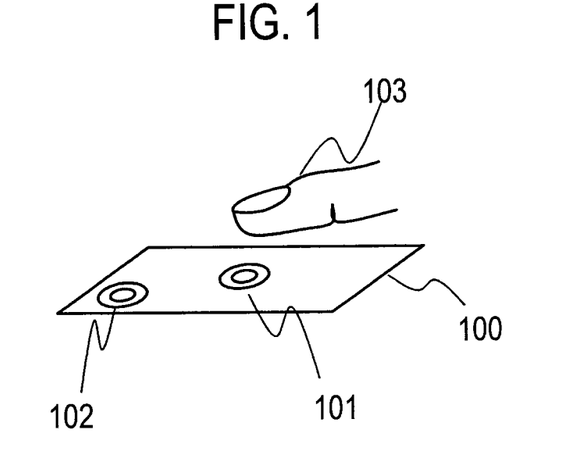
FIG. 1 is a schematic configuration diagram of a proximity sensor according to the present invention.

FIG. 1 is a schematic configuration diagram of a proximity sensor according to the present invention. FIG. 1 illustrates a proximity sensor 100 viewed from side, and the proximity sensor 100 includes a first photosensor 101 and a second photosensor 102.

The first photosensor 101 is placed in an area which is shielded from light by a finger 103 or the like when the proximity sensor 100 detects the finger 103 or the like as coming close thereto, to thereby detect that light is blocked by the finger 103 or the like. The second photosensor 102 is placed in an area which is not shielded from light by the finger 103 or the like when the proximity sensor 100 detects the finger 103 or the like as coming close thereto, to thereby detect ambient brightness.

When ambient brightness is high and the proximity sensor 100 is shielded from light by the finger 103 or the like, an amount of light entering the first photosensor 101 reduces, whereas an amount of light entering the second photosensor 102 does not change. In this case, the proximity sensor 100 outputs a detection signal.

When ambient brightness is high and the proximity sensor 100 is not shielded from light by the finger 103 or the like, neither the amount of light entering the first photosensor 101 nor the amount of light entering the second photosensor 102 changes. In this case, the proximity sensor 100 outputs a non-detection signal.

When ambient brightness is low, the amount of light entering the second photosensor 102 reduces. In this case, the proximity sensor 100 outputs a non-detection signal even when the first photosensor 101 thereof is shielded from light by the finger 103 or the like. Because the first photosensor 101 cannot discriminate between the case where the ambient is dark and the case where light is blocked by the finger 103 or the like, the second photosensor 102 detects the ambient brightness so as to discriminate between the case where the ambient is dark and the case where light is blocked by the finger 103 or the like.

This way, the proximity sensor 100 according to the present invention is capable of, under high ambient brightness, outputting a detection signal when the proximity sensor 100 is shielded from light by the finger 103 or the like, while outputting a non-detection signal when the finger 103 or the like moves away from the proximity sensor 100. Under low ambient brightness, on the other hand, the proximity sensor 100 is capable of outputting a non-detection signal.

Note that, the proximity sensor 100 according to the present invention described above is configured to output a non-detection signal under low ambient brightness, but, of course, may be configured to output a detection signal under low ambient brightness. Further, it should be understood that the same operation can also be performed when the first photosensor 101 and the second photosensor 102 each include a plurality of photosensors. Still further, it should be understood that the proximity sensor 100 may have a concave portion formed in the surface thereof so that the first photosensor 101 and the second photosensor 102 are disposed at the center of the concave portion instead of the surface of the proximity sensor 100 to prevent degradation of the detection sensitivity due to obliquely entering light.

First Embodiment

Figure 2:
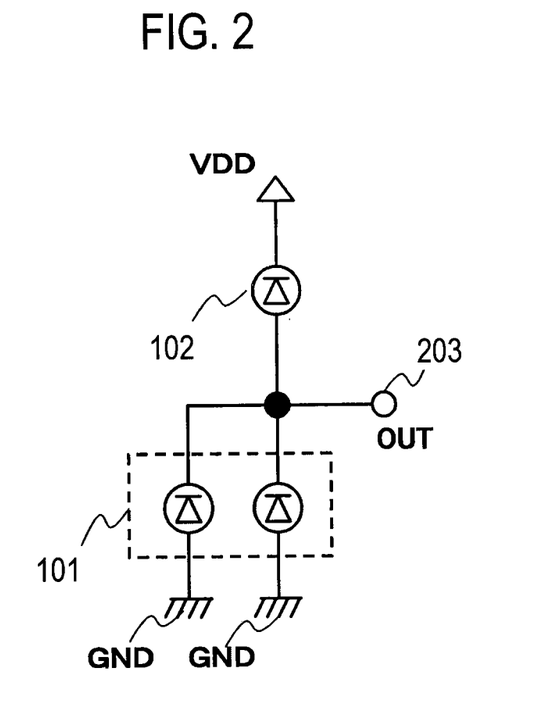
FIG. 2 is a schematic circuit diagram illustrating a first embodiment of the proximity sensor according to the present invention.

FIG. 2 is a schematic circuit diagram illustrating a first embodiment of the proximity sensor according to the present invention. As illustrated in FIG. 2, the first photosensor 101 includes two photodiodes connected in parallel, each of which has an anode connected to a reference power supply terminal GND and a cathode connected to an output terminal 203. The second photosensor 102 includes a photodiode in which an anode is connected to the output terminal 203 and a cathode is connected to a positive power supply terminal VDD.

Next, an operation of the proximity sensor is described. For example, it is assumed that the photodiodes used in the first photosensor 101 and the second photosensor 102 have the same sensitivity. Because the first photosensor 101 uses the two photodiodes connected in parallel, if the amount of light entering the first photosensor 101 is reduced to half or less of that entering the second photosensor 102, a signal of the output terminal 203 may be inverted from Low (hereinafter abbreviated as L) to High (hereinafter abbreviated as H). In other words, when the finger 103 or the like is coming close to the first photosensor 101 under high ambient brightness, the finger 103 or the like may be detected at a timing when the amount of light entering the first photosensor 101 is reduced to half of that entering the second photosensor 102. Accordingly, the detection may be made even before the finger 103 or the like completely blocks light, and further a detection distance less varies with the change in ambient brightness. Besides, the amount of light to be detected may be adjusted by changing the numbers of photodiodes used in the first photosensor 101 and the second photosensor 102, which is easy adjustment. On the other hand, when the ambient brightness becomes low, a dark current flowing through the first photosensor 101 becomes larger than a dark current flowing through the second photosensor 102, and hence the signal of the output terminal 203 changes to L.

It should be understood that the same detection can also be made when two or more second photosensors 102 are connected in parallel.

Second Embodiment

Figure 3:
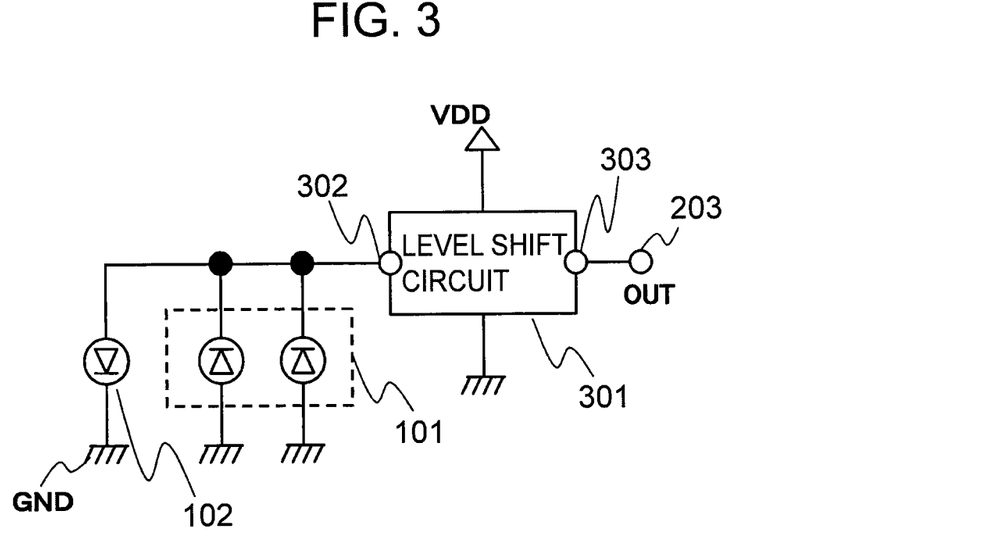
FIG. 3 is a schematic circuit diagram illustrating a second embodiment of the proximity sensor according to the present invention.

FIG. 3 is a schematic circuit diagram illustrating a second embodiment of the proximity sensor according to the present invention. As illustrated in FIG. 3, the first photosensor 101 includes two photodiodes connected in parallel, each of which has an anode connected to a reference power supply terminal GND and a cathode connected to an input terminal 302 of a level shift circuit 301. The second photosensor 102 includes a photodiode in which an anode is connected to the input terminal 302 of the level shift circuit 301 and a cathode is connected to the reference power supply terminal GND. The level shift circuit 301 has an inverted signal output terminal 303 connected to an output terminal 203.

Next, an operation of the proximity sensor is described. When ambient brightness is high and the finger 103 or the like is not coming close to the first photosensor 101, a photocurrent flows from the cathodes to the anodes of the first photosensor 101 while a voltage and a current are generated at the cathode of the second photosensor 102. In this case, the photocurrent of the first photosensor 101 flows twice as much as the generated current of the second photosensor 102, and hence the input terminal 302 of the level shift circuit 301 has a voltage of L. Therefore, H is output to the inverted signal output terminal 303 of the level shift circuit 301, and then H is output to the output terminal 203.

When ambient brightness is high and the finger 103 or the like is coming close to the first photosensor 101, a photocurrent flows from the cathodes to the anodes of the first photosensor 101 while a voltage and a current are generated at the cathode of the second photosensor 102. In this case, the amount of light entering the first photosensor 101 is reduced to less than half of that entering the second photosensor 102 because of the finger 103 or the like, and hence the photocurrent of the first photosensor 101 is smaller than the generated current of the second photosensor 102. Accordingly, the input terminal 302 of the level shift circuit 301 has the same voltage as the generated voltage of the second photosensor 102. Therefore, L is output to the inverted signal output terminal 303 of the level shift circuit 301, and then L is output to the output terminal 203.

Under low ambient brightness, no voltage is generated at the anode of the second photosensor 102, and hence the input terminal 302 of the level shift circuit 301 has a voltage of L. Then, a signal of H is output from the inverted signal output terminal 303, and a signal of H is also output from the output terminal 203.

As described above, the second embodiment of the proximity sensor according to the present invention has the same function and feature as the first embodiment of the proximity sensor according to the present invention illustrated in FIG. 2, except that the polarity of the output signal is reverse. Further, the second photosensor 102 consumes no photocurrent, which flows in the first embodiment as current consumption, and hence lower current consumption may be achieved.

It should be understood that the same detection can also be made when two or more second photosensors 102 are connected in parallel.

Figure 8:
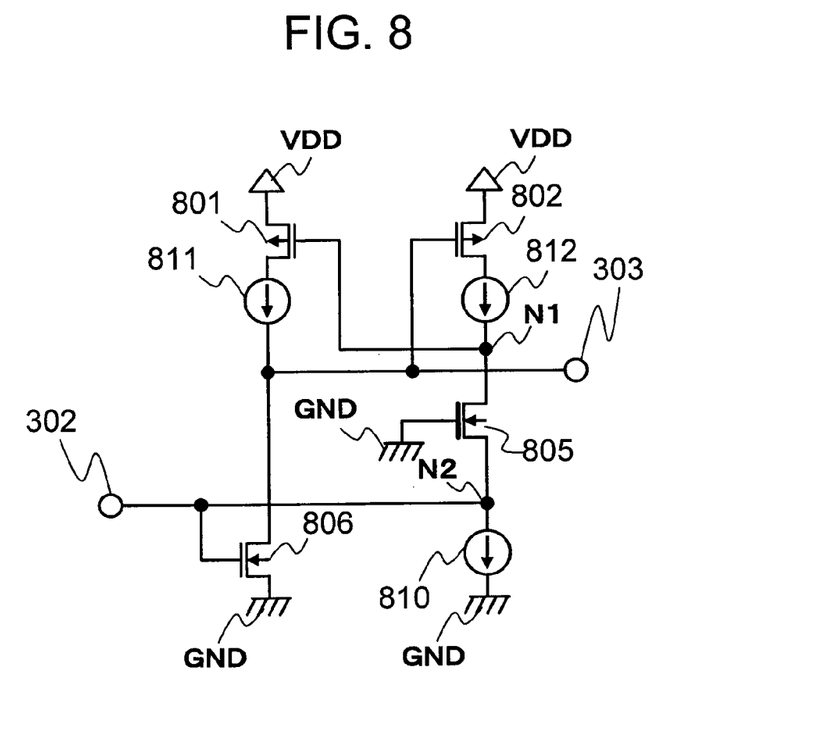
FIG. 8 is a circuit diagram of a level shift circuit included in the proximity sensor according to the present invention.

FIG. 8 illustrates a circuit diagram of the level shift circuit 301 used in the above-mentioned second embodiment of the proximity sensor according to the present invention. As illustrated in FIG. 8, a P-channel MOS transistor 801 has a source connected to the positive power supply terminal VDD, a gate connected to a node N1, and a drain connected to a current inflow terminal of a constant current circuit 811. An N-channel MOS transistor 806 has a source connected to the reference power supply terminal GND, a gate connected to the input terminal 302, and a drain connected to the inverted signal output terminal 303. A P-channel MOS transistor 802 has a source connected to the positive power supply terminal VDD, a gate connected to the inverted signal output terminal 303, and a drain connected to a current inflow terminal of a constant current circuit 812. A depletion type N-channel MOS transistor 805 has a source connected to the input terminal 302, a gate connected to the reference power supply terminal GND, and a drain connected to the node N1. A constant current circuit 810 has a current inflow terminal connected to the input terminal 302 and a current outflow terminal connected to the reference power supply terminal GND. The constant current circuit 811 has a current outflow terminal connected to the inverted signal output terminal 303. The constant current circuit 812 has a current outflow terminal connected to the node N1. Although not illustrated, the positive power supply terminal VDD is supplied with a positive voltage from a power source while the reference power supply terminal GND is supplied with a zero-volt voltage from the power source. Note that, the constant current circuit 810 and the constant current circuit 812 are configured such that the constant current circuit 810 has a larger constant current value than the constant current circuit 812.

Next, an operation of the level shift circuit 301 is described. First, if L is input to the input terminal 302, the N-channel MOS transistor 806 is turned OFF and the depletion type N-channel MOS transistor 805 is turned ON. The voltage at the node N1 is discharged to around the voltage at the reference power supply terminal GND with an ON-state current of the depletion type N-channel MOS transistor 805. Then, the P-channel MOS transistor 801 is turned ON to raise the voltage at the inverted signal output terminal 303 of the level shift circuit 301 to around the voltage at the positive power supply terminal VDD. Because the voltage at the inverted signal output terminal 303 of the level shift circuit 301 is raised to around the voltage at the positive power supply terminal VDD, the P-channel MOS transistor 802 is turned OFF. This way, H is output to the inverted signal output terminal 303.

Next, if the generated voltage of the second photosensor 102 is input to the input terminal 302, the depletion type N-channel MOS transistor 805 is turned OFF and the N-channel MOS transistor 806 is turned ON. The voltage at the inverted signal output terminal 303 is discharged to the voltage around the reference power supply terminal GND with an ON-state current of the N-channel MOS transistor 806. Then, the P-channel MOS transistor 802 is turned ON to raise the voltage at the node N1 to around the voltage at the positive power supply terminal VDD. Because the voltage at the node N1 is raised to around the voltage at the positive power supply terminal VDD, the P-channel MOS transistor 801 is turned OFF. This way, L is output to the inverted signal output terminal 303.

As described above, the level shift circuit 301 illustrated in FIG. 8 has a function of converting the signal of the second photosensor 102 of generated-voltage level into an inverted signal of CMOS level and then outputting the signal. Further, any of the MOS transistors on a current path from the positive power supply terminal VDD to the reference power supply terminal GND is turned OFF, and hence only a leakage current of the turned-OFF MOS transistor results in current consumption. Note that, the current value of the constant current circuit 810 is designed to be too small to affect a ratio of flowing currents between the first photosensor 101 and the second photosensor 102 illustrated in FIG. 3.

Figure 9:
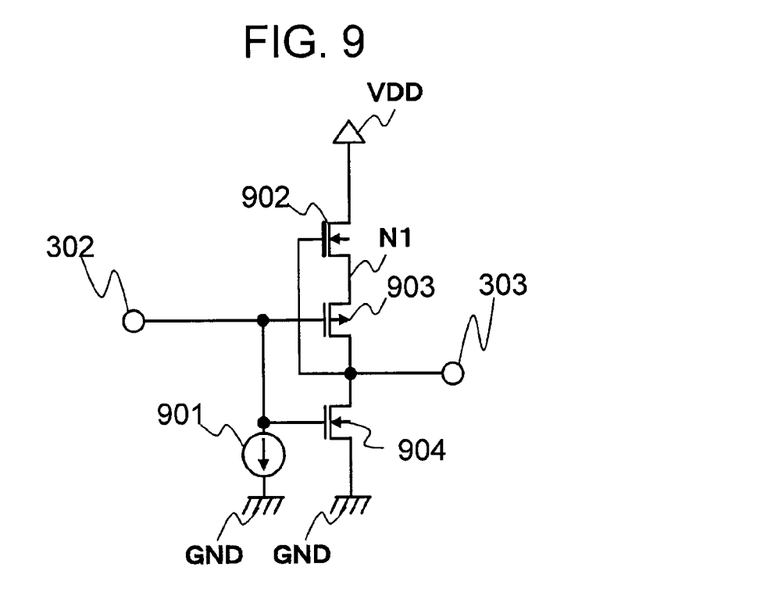
FIG. 9 is another circuit diagram of the level shift circuit included in the proximity sensor according to the present invention.

FIG. 9 illustrates another circuit diagram of the level shift circuit 301 used in the above-mentioned second embodiment of the proximity sensor according to the present invention, which is realized by a different configuration from FIG. 8. As illustrated in FIG. 9, a depletion type N-channel MOS transistor 902 has a drain connected to the positive power supply terminal VDD, a source connected to the node N1, and a gate connected to the inverted signal output terminal 303. A P-channel MOS transistor 903 has a drain connected to the inverted signal output terminal 303, a source connected to the node N1, and a gate connected to the input terminal 302. An N-channel MOS transistor 904 has a drain connected to the inverted signal output terminal 303, a source connected to the reference power supply terminal GND, and a gate connected to the input terminal 302. A constant current circuit 901 has a current inflow terminal connected to the input terminal 302 and a current outflow terminal connected to the reference power supply terminal GND. Note that, although not illustrated, the positive power supply terminal VDD is supplied with a positive voltage from a power source while the reference power supply terminal GND is supplied with a zero-volt voltage from the power source.

Next, an operation of the level shift circuit 301 is described. If L is input to the input terminal 302, the N-channel MOS transistor 904 is turned OFF. Then, the node N1 has an absolute value of a threshold voltage of the P-channel MOS transistor 903, and accordingly an absolute value of a threshold voltage of the depletion type N-channel MOS transistor 902 becomes larger than the voltage at the node N1 to turn ON the depletion type N-channel MOS transistor 902. After the depletion type N-channel MOS transistor 902 is turned ON, the voltage at the node N1 becomes higher than the absolute value of the threshold voltage of the P-channel MOS transistor 903 to turn ON the P-channel MOS transistor 903. After the P-channel MOS transistor 903 is turned ON, the voltage at the inverted signal output terminal 303 is raised to be equal to the voltage at the node N1. Then, the voltage at the node N1 rises to the voltage at the positive power supply terminal VDD with a current of the depletion type N-channel MOS transistor 902 which still remains in the ON state along with the rise of the voltage at the inverted signal output terminal 303. Therefore, the inverted signal output terminal 303 outputs H.

Next, if H is input to the input terminal 302, the N-channel MOS transistor 904 is turned ON to discharge the voltage at the inverted signal output terminal 303 to the voltage at the reference power supply terminal GND with a current of the N-channel MOS transistor 904. Accordingly, the inverted signal output terminal 303 outputs L. Then, the voltage at the node N1 takes a value obtained by adding the absolute value of the threshold voltage of the P-channel MOS transistor 903 to the voltage at the input terminal 302. The value exceeds the absolute value of the threshold voltage of the depletion type N-channel MOS transistor 902, and hence the depletion type N-channel MOS transistor 902 is turned OFF.

As described above, the level shift circuit illustrated in FIG. 9 may have the same function as that of the above-mentioned level shift circuit illustrated in FIG. 8. Further, any of the MOS transistors on a current path from the positive power supply terminal VDD to the reference power supply terminal GND is turned OFF, and hence current consumption is equal to the current consumption of the above-mentioned level shift circuit illustrated in FIG. 8. Note that, the current value of the constant current circuit 901 is designed to be too small to affect the ratio of flowing currents between the first photosensor 101 and the second photosensor 102 illustrated in FIG. 3.

Third Embodiment

Figure 4:
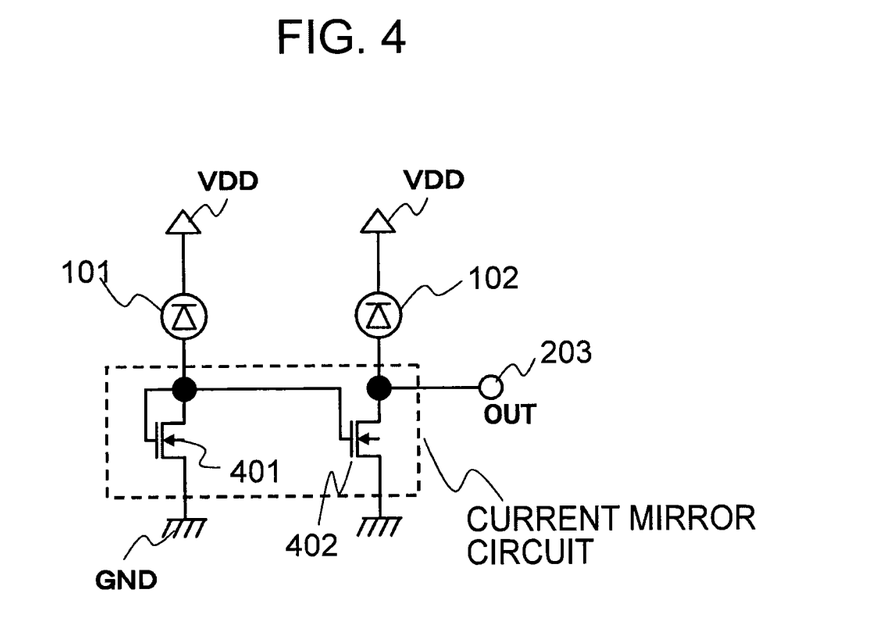
FIG. 4 is a schematic circuit diagram illustrating a third embodiment of the proximity sensor according to the present invention.

FIG. 4 is a schematic circuit diagram illustrating a third embodiment of the proximity sensor according to the present invention. As illustrated in FIG. 4, the first photosensor 101 includes a photodiode in which an anode is connected to a gate and a drain of an N-channel MOS transistor 401 and a cathode is connected to the positive power supply terminal VDD. The second photosensor 102 includes a photodiode in which an anode is connected to a drain of an N-channel MOS transistor 402 and the output terminal 203 and a cathode is connected to the positive power supply terminal VDD. The N-channel MOS transistor 401 has a source connected to the reference power supply terminal GND. The N-channel MOS transistor 402 has a source connected to the reference power supply terminal GND and a gate connected to the gate of the N-channel MOS transistor 401.

Next, an operation of the circuit is described. The N-channel MOS transistor 401 and the N-channel MOS transistor 402 together form a current mirror circuit, in which a current flowing through the N-channel MOS transistor 401 is doubled and mirrored into the N-channel MOS transistor 402. For example, it is assumed that the photodiodes used in the first photosensor 101 and the second photosensor 102 have the same sensitivity. When ambient brightness is high and the finger 103 or the like is not coming close to the first photosensor 101, the current of the N-channel MOS transistor 402 determined by mirroring the current flowing through the first photosensor 101 is larger than the current flowing through the second photosensor 102, and accordingly L is output to the output terminal 203. When ambient brightness is high and the finger 103 or the like is coming close to the first photosensor 101, the amount of light entering the first photosensor 101 is reduced to less than half that entering the second photosensor 102 because of the finger 103 or the like. Therefore, the current of the N-channel MOS transistor 402 determined by mirroring the current flowing through the first photosensor 101 becomes smaller than the current flowing through the second photosensor 102, and accordingly H is output to the output terminal 203. Note that, under low ambient brightness, no current flows through the second photosensor 102 and accordingly the output terminal 203 becomes L. This way, there may be realized a proximity sensor 100 capable of detecting that the amount of light entering the first photosensor 101 has been reduced to less than half that entering the second photosensor 102 because of the finger 103 or the like.

As described above, the third embodiment of the proximity sensor according to the present invention has the same function and feature as the first embodiment of the proximity sensor according to the present invention illustrated in FIG. 2. Changing the current ratio between the first photosensor 101 and the second photosensor 102 is possible by changing the mirror ratio of the current mirror circuit, without increasing the number of photosensors. Therefore, downsizing is possible and further the sensitivity of the proximity sensor may be adjusted with ease through the change in mirror ratio of the current mirror circuit.

Fourth Embodiment

Figure 5:
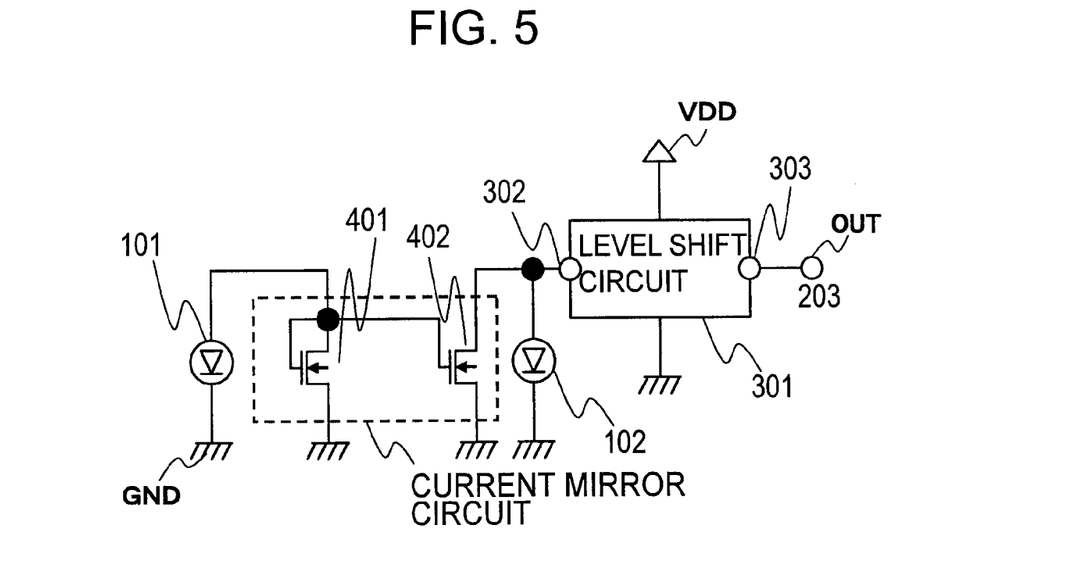
FIG. 5 is a schematic circuit diagram illustrating a fourth embodiment of the proximity sensor according to the present invention.

FIG. 5 is a schematic circuit diagram illustrating a fourth embodiment of the proximity sensor according to the present invention. As illustrated in FIG. 5, the first photosensor 101 includes a photodiode in which an anode is connected to a gate and a drain of an N-channel MOS transistor 401 and a cathode is connected to the reference power supply terminal GND. The second photosensor 102 includes a photodiode in which an anode is connected to a drain of an N-channel MOS transistor 402 and an input terminal 302 of a level shift circuit 301 and a cathode is connected to the reference power supply terminal GND. The N-channel MOS transistor 401 has a source connected to the reference power supply terminal GND. The N-channel MOS transistor 402 has a source connected to the reference power supply terminal GND and a gate connected to the gate of the N-channel MOS transistor 401. The level shift circuit 301 has an inverted signal output terminal 303 connected to an output terminal 203. Note that, the level shift circuit 301 has the same configuration as that of the level shift circuit 301 used in the above-mentioned second embodiment of the proximity sensor according to the present invention, and hence description of the configuration and operation thereof is omitted.

Next, an operation of the circuit is described. The N-channel MOS transistor 401 and the N-channel MOS transistor 402 together form a current mirror circuit, in which a current flowing through the N-channel MOS transistor 401 is doubled and mirrored into the N-channel MOS transistor 402. For example, it is assumed that the photodiodes used in the first photosensor 101 and the second photosensor 102 have the same power generation characteristics.

When ambient brightness is high and the finger 103 or the like is not coming close to the first photosensor 101, a current is generated at the first photosensor 101. A current of the N-channel MOS transistor 402 determined by mirroring the generated current is larger than a generated current from the second photosensor 102. Therefore, the input terminal 302 of the level shift circuit 301 becomes L and the output terminal 203 becomes H.

When ambient brightness is high and the finger 103 or the like is coming close to the first photosensor 101, the amount of light entering the first photosensor 101 is reduced to less than half that entering the second photosensor 102 because of the finger 103 or the like. Therefore, the current of the N-channel MOS transistor 402 determined by mirroring the generated current from the first photosensor 101 becomes smaller than the generated current from the second photosensor 102. Consequently, the input terminal 302 of the level shift circuit 301 has the generated voltage of the second photosensor 102, and the output terminal 203 becomes L.

Under low ambient brightness, no voltage is generated in the second photosensor 102, and hence the input terminal 302 of the level shift circuit 301 is L and the output terminal 203 becomes H. This way, there may be realized a proximity sensor capable of detecting that the amount of light entering the first photosensor 101 has been reduced to less than half that entering the second photosensor 102 because of the finger 103 or the like.

As described above, the fourth embodiment of the proximity sensor according to the present invention has the same function and feature as the second embodiment of the proximity sensor according to the present invention illustrated in FIG. 3. Changing the current ratio between the first photosensor 101 and the second photosensor 102 is possible by changing the mirror ratio of the current mirror circuit, without increasing the number of photosensors. Therefore, downsizing is possible and further the sensitivity of the proximity sensor may be adjusted with ease through the change in mirror ratio of the current mirror circuit.

Fifth Embodiment

Figure 6:
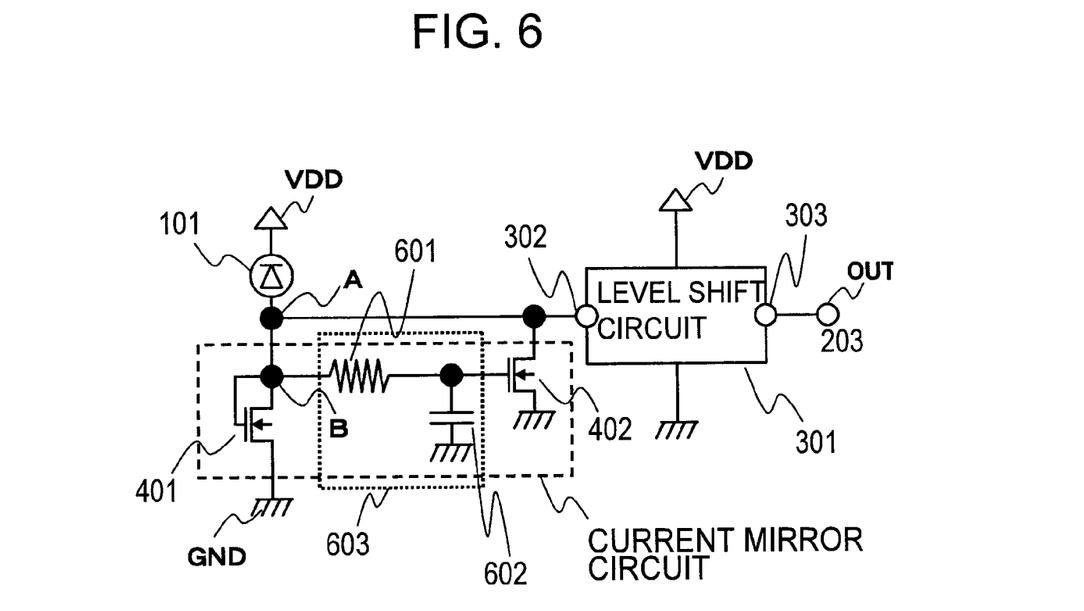
FIG. 6 is a schematic circuit diagram illustrating a fifth embodiment of the proximity sensor according to the present invention.

FIG. 6 is a schematic circuit diagram illustrating a fifth embodiment of the proximity sensor according to the present invention. As illustrated in FIG. 6, the fifth embodiment has a configuration of detecting a change in amount of light entering the first photosensor 101. Note that, using exactly the same configuration as that illustrated in FIG. 6, there may be realized another configuration of detecting the change in amount of light entering the second photosensor 102 illustrated in FIG. 1, and hence description thereof is omitted.

First, connection in the circuit is described. The first photosensor 101 includes a photodiode in which an anode is connected to the gate and the drain of the N-channel MOS transistor 401, the input terminal 302 of the level shift circuit 301, and an input of a delay circuit 603, and a cathode is connected to the positive power supply terminal VDD. The N-channel MOS transistor 401 has a source connected to the reference power supply terminal GND. The N-channel MOS transistor 402 has a source connected to the reference power supply terminal GND, a gate connected to an output of the delay circuit 603, and a drain connected to the input terminal 302 of the level shift circuit 301. The level shift circuit 301 has an inverted signal output terminal 303 connected to the output terminal 203. A delay circuit 601 has an input connected to one end of a resistor 601, an output connected to another end of the resistor 601 and one end of a capacitor 602. Another end of the capacitor 602 is connected to the reference power supply terminal GND. Note that, the level shift circuit 301 has the same configuration as that of the level shift circuit 301 used in the above-mentioned second embodiment of the proximity sensor according to the present invention, and hence description of the configuration and operation thereof is omitted.

Next, an operation of the fifth embodiment of the proximity sensor is described. The N-channel MOS transistor 401 and the N-channel MOS transistor 402 together form a current mirror circuit. It is assumed that a current that flows through the first photosensor 101 when the finger 103 or the like is not coming close to the first photosensor 101 is a current 21, and that a mirror ratio of the current mirror circuit is 1:1. A current I then flows through each of the N-channel MOS transistors 401 and 402. Then, the input terminal 302 of the level shift circuit 301 has a gate voltage of the N-channel MOS transistor 401 which allows the current I to flow. Therefore, L is output to the output terminal 203. When the finger 103 or the like is coming close to the first photosensor 101 and the current flowing through the first photosensor 101 reduces to less than I, the gate of the N-channel MOS transistor 402 keeps a constant voltage for a given period of time by means of the capacitor 602. Accordingly, the N-channel MOS transistor 402 operates to allow the current I to flow. The current flowing through the N-channel MOS transistor 402 is larger than the current flowing through the first photosensor 101, and hence the input terminal 302 of the level shift circuit 301 becomes L and the output terminal 203 becomes H. After a while, the electric charges are removed from the capacitor 602, and a current I/2 flows through each of the N-channel MOS transistors 401 and 402. Then, the input terminal 302 of the level shift circuit 301 is raised again to the gate voltage of the N-channel MOS transistor 401 which allows the current I to flow. Consequently, the output terminal 203 becomes L again. This way, there may be realized a proximity sensor capable of detecting that the amount of light entering the first photosensor 101 has been reduced to half that entering the second photosensor 102 because of the finger 103 or the like, and further outputting H to the output terminal 203 for a given period of time.

The single proximity sensor using the above-mentioned photosensor 101 cannot discriminate between the case where the ambient brightness changes and the case where the finger 103 or the like is coming close thereto. Accordingly, another proximity sensor having exactly the same configuration using the second photosensor 102 is added to an area which is not to be covered by the finger 103 or the like. In such a case, when the proximity sensor using the second photosensor 102 responds, it is determined that the ambient brightness has changed. This way, the discrimination is made between the case where the finger 103 or the like blocks light and the case where the ambient is dark.

In a case where the finger 103 or the like is slowly coming close to the first photosensor 101, the gate of the N-channel MOS transistor 402 does not keep a constant voltage for a given period of time, and gradually reduces the current flowing through the NMOS transistor 402. In such a case, the input to the level shift circuit 301 never becomes L. L is output only when the finger 103 or the like has come close to the first photosensor 101 before the given period of time during which the gate of the N-channel MOS transistor 402 keeps a constant voltage elapses. Note that, the given period of time may be adjusted by the magnitude of the resistor 601 and the capacitor 602.

As described above, according to the fifth embodiment of the proximity sensor of the present invention, there may be realized a proximity sensor capable of detecting that a finger or the like has come close to a given distant at a given speed or faster. Further, in a case where the surface of the first photosensor 101 becomes dirty to reduce the amount of light entering the first photosensor 101 to half of that entering the second photosensor 102, all the proximity sensors according to the first to fourth embodiments of the present invention make an erroneous detection. However, the proximity sensor according to the fifth embodiment of the present invention does not make an erroneous detection in such a case because of the configuration capable of detecting that the amount of incident light has changed by a desired amount at a desired rate.

It should be understood that the resistor 601 illustrated in FIG. 6 may be short-circuited to interpose a resistor between the node A and the node B so that the same function is realized. Further, the delay circuit may also be realized by another type of using no resistor nor capacitor.

Sixth Embodiment

Figure 7:
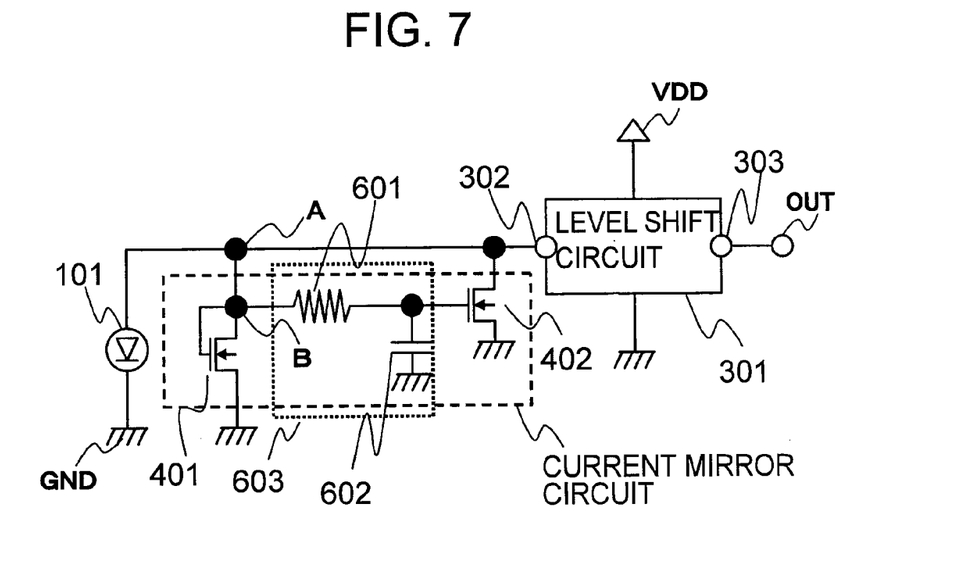
FIG. 7 is a schematic circuit diagram illustrating a sixth embodiment of the proximity sensor according to the present invention.

FIG. 7 is a schematic circuit diagram illustrating a sixth embodiment of the proximity sensor according to the present invention. The difference from the configuration of the fifth embodiment of the proximity sensor according to the present invention illustrated in FIG. 6 only resides in that the cathode of the first photosensor 101 is connected to the reference power supply terminal GND.

Assuming that the current supplied from the first photosensor 101 serves as a generated current, the proximity sensor according to the sixth embodiment operates to detect the generated current in a similar manner to the fifth embodiment of the proximity sensor according to the present invention. Using the configuration of detecting the generated current of the first photosensor 101 reduces current consumption by the photocurrent. Note that, similarly to the fifth embodiment, the second photosensor 102 may be used to discriminate from the case where the ambient is dark.

Hereinabove, the first to sixth embodiments of the proximity sensor according to the present invention have described the case of detecting that the light shield amount of the first photosensor 101 due to the finger 103 or the like is reduced to about half. However, it should be understood that the light shield amount to be detected may be adjusted by changing the numbers of the first photosensors 101 and the second photosensors 102 or the electric generation performance thereof. Further, the first to fourth embodiments of the proximity sensor according to the present invention each have a configuration of comparing the currents of the first photosensor 101 and the second photosensor 102 with a ratio of 2:1. However, it should be understood that the same function may also be realized, except for the function of discriminating from the case where the ambient is dark, when the ratio is reversed to invert the output signal.

It should be understood that the first photosensor 101 and the second photosensor 102 may be any sensor, including a photodiode and an LED, as long as the sensor has diode characteristics and photoelectric conversion characteristics.

What is claimed is:

1. A proximity sensor using a photosensor, the proximity sensor comprising:
a first photosensor including a first PN junction element; and
a second photosensor including a second PN junction element
wherein the first PN junction element and the second PN junction element flow different amounts of current depending on an amount of incident light, and wherein an anode of the second PN junction element is connected to a cathode of the first PN junction element and one of the first or second photosensors is located at a position for detecting an object and the other thereof is located at a different position where the object is not detected, and
a connection point between the first and second photosensors comprises an output terminal of the proximity sensor.

2. A proximity sensor according to claim 1,
wherein the first photosensor includes a plurality of PN junction elements and each include a cathode connected to the output terminal and an anode connected to a ground terminal, and
wherein the second PN junction element of the second photosensor includes a cathode connected to a power supply terminal and the anode is connected to the output terminal.

3. A proximity sensor comprising:
a first photosensor for detecting a target;
a second photosensor in an area in which the target is not detected, for detecting ambient light,
wherein the first photosensor comprises a plurality of PN junction elements connected in parallel and each of the plurality of PN junction elements are connected to an output terminal, and the second photosensor comprises at least one PN junction element connected to the output terminal; and
a level shift circuit,
wherein the plurality of PN junction elements of the first photosensor each include a cathode connected to an input terminal of the level shift circuit and an anode connected to a ground terminal, and
wherein the at least one PN junction element of the second photosensor includes a cathode connected to the ground terminal and an anode connected to the input terminal of the level shift circuit.

4. A proximity sensor according to claim 3, wherein the level shift circuit comprises:
a second constant current circuit for discharging a second node;
a depletion type N-channel MOS transistor including a gate to which a voltage of the ground terminal is input and a source to which a voltage of the second node is input, for discharging a first node with an ON-state current of the depletion type N-channel MOS transistor;
a first P-channel MOS transistor including a gate to which a voltage of the first node is input, for charging an output terminal via a third constant current circuit with an ON-state current of the first P-channel MOS transistor;
an N-channel MOS transistor including a gate to which the voltage of the second node is input, for discharging the output terminal with an ON-state current of the N-channel MOS transistor; and a second P-channel MOS transistor including a gate to which a voltage of the output terminal is input, for charging the first node with an ON-state current of the second P-channel MOS transistor.

5. A proximity sensor according to claim 3, wherein the level shift circuit comprises:
   a constant current circuit has an inflow terminal connected to the input terminal and an outflow terminal connected to a reference power supply;
   an N-channel MOS transistor including a gate connected to the input terminal and a drain connected to an output terminal;
   a P-channel MOS transistor including a gate connected to the input terminal, a drain connected to the output terminal, and a source connected to a node; and
   a depletion type N-channel MOS transistor including a gate connected to the output terminal, a drain connected to a power supply, and a source connected to the node.

6. A proximity sensor comprising:
   a first photosensor for detecting a target; and
   a second photosensor in an area in which the target is not detected, for detecting ambient light,
   wherein the first photosensor comprises a plurality of PN junction elements connected in parallel and each of the plurality of PN junction elements are connected to an output terminal, and the second photosensor comprises at least one PN junction element connected to the output terminal;
   a first N-channel MOS transistor including a source connected to a ground terminal; and
   a second N-channel MOS transistor including a source connected to the ground terminal and a gate connected to a gate of the first N-channel MOS transistor,
   wherein the plurality of PN junction elements of the first photosensor each include an anode connected to the gate and a drain of the first N-channel MOS transistor, and a cathode connected to a power supply terminal, and
   wherein the at least one PN junction element of the second photosensor includes an anode connected to the output terminal and a drain of the second N-channel MOS transistor, and a cathode connected to the power supply terminal.

7. A proximity sensor comprising:
   a first photosensor for detecting a target;
   a second photosensor in an area in which the target is not detected, for detecting ambient light,
   wherein the first photosensor comprises a plurality of PN junction elements connected in parallel and each of the plurality of PN junction elements are connected to an output terminal, and the second photosensor comprises at least one PN junction element connected to the output terminal; and
   a level shift circuit;
   a first N-channel MOS transistor including a source connected to a ground terminal; and
   a second N-channel MOS transistor including a source connected to the ground terminal and a gate connected to a gate of the first N-channel MOS transistor,
   wherein the plurality of PN junction elements of the first photosensor each include a cathode connected to the ground terminal and an anode connected to the gate and a drain of the first N-channel MOS transistor, and
   wherein the at least one PN junction element of the second photosensor includes a cathode connected to the ground terminal and an anode connected to an input terminal of the level shift circuit and a drain of the second N-channel MOS transistor.

8. A proximity sensor according to claim 7, wherein the level shift circuit comprises:
   a second constant current circuit for discharging a second node;
   a depletion type N-channel MOS transistor including a gate to which a voltage of the ground terminal is input and a source to which a voltage of the second node is input, for discharging a first node with an ON-state current of the depletion type N-channel MOS transistor;
   a first P-channel MOS transistor including a gate to which a voltage of the first node is input, for charging an output terminal via a third constant current circuit with an ON-state current of the first P-channel MOS transistor;
   an N-channel MOS transistor including a gate to which the voltage of the second node is input, for discharging the output terminal with an ON-state current of the N-channel MOS transistor; and
   a second P-channel MOS transistor including a gate to which a voltage of the output terminal is input, for charging the first node via a first constant circuit with an ON-state current of the second P-channel MOS transistor.

9. A proximity sensor according to claim 7, wherein the level shift circuit comprises:
   a constant current circuit having an inflow terminal connected to the input terminal and an outflow terminal connected to a reference power supply;
   an N-channel MOS transistor including a gate connected to the input terminal and a drain connected to an output terminal;
   a P-channel MOS transistor including a gate connected to the input terminal, a drain connected to the output terminal, and a source connected to a node; and
   a depletion type N-channel MOS transistor including a gate connected to the output terminal, a drain connected to a power supply, and a source connected to the node.

10. A proximity sensor using a photosensor, comprising:
    a photosensor for detecting a target;
    a level shift circuit including an input terminal connected to the photosensor; and
    a current mirror circuit connected to the input terminal of the level shift circuit,
    wherein the current mirror circuit comprises:
      a first N-channel MOS transistor including a gate and a drain that are connected to the input terminal of the level shift circuit, and a source connected to a ground terminal;
      a second N-channel MOS transistor including a drain connected to the input terminal of the level shift circuit and a source connected to the ground terminal; and
      a delay circuit connected to a gate of the first N-channel MOS transistor and a gate of the second N-channel MOS transistor.

11. A proximity sensor according to claim 10, wherein the photosensor comprises one or a plurality of PN junction elements connected in parallel, each of which includes an anode connected to the input terminal of the level shift circuit and a cathode connected to a power supply terminal.

12. A proximity sensor according to claim 10, wherein the photosensor comprises one or a plurality of PN junction elements connected in parallel, each of which includes an anode connected to the input terminal of the level shift circuit and a cathode connected to a ground terminal.

13. A proximity sensor according to claim 10, wherein the level shift circuit comprises:
- a second constant current circuit for discharging a second node;
- a depletion type N-channel MOS transistor including a gate to which a voltage of the ground terminal is input and a source to which a voltage of the second node is input, for discharging a first node with an ON-state current of the depletion type N-channel MOS transistor;
- a first P-channel MOS transistor including a gate to which a voltage of the first node is input, for charging an output terminal via a third constant current circuit with an ON-state current of the first P-channel MOS transistor;
- an N-channel MOS transistor including a gate to which the voltage of the second node is input, for discharging the output terminal with an ON-state current of the N-channel MOS transistor; and
- a second P-channel MOS transistor including a gate to which a voltage of the output terminal is input, for charging the first node with an ON-state current of the second P-channel MOS transistor.

14. A proximity sensor according to claim 10, wherein the level shift circuit comprises:
- a constant current circuit having an inflow terminal connected to the input terminal and an outflow terminal connected to a reference power supply;
- an N-channel MOS transistor including a gate connected to the input terminal and a drain connected to an output terminal;
- a P-channel MOS transistor including a gate connected to the input terminal, a drain connected to the output terminal, and a source connected to a node; and
- a depletion type N-channel MOS transistor including a gate connected to the output terminal, a drain connected to a power supply, and a source connected to the node.

* * * * *